(12) United States Patent
Duan et al.

(10) Patent No.: US 12,362,841 B2
(45) Date of Patent: Jul. 15, 2025

(54) DATA COMMUNICATION APPARATUS WITH RECEIVER EMPLOYING TRANSMITTER SUPPLY VOLTAGE NOISE COMPENSATION

(71) Applicant: QUALCOMM Incorporated, San Diego, CA (US)

(72) Inventors: Ying Duan, San Diego, CA (US); Seuk Son, San Diego, CA (US); Qinqing Cao, San Diego, CA (US); Panchami Devashya Shivarama, San Diego, CA (US); Abhay Dixit, San Diego, CA (US); Dhaval Sejpal, San Diego, CA (US); Mansoor Basha Shaik, Bangalore (IN)

(73) Assignee: QUALCOMM INCORPORATED, San Diego, CA (US)

( * ) Notice: Subject to any disclaimer, the term of this patent is extended or adjusted under 35 U.S.C. 154(b) by 105 days.

(21) Appl. No.: 18/345,589

(22) Filed: Jun. 30, 2023

(65) Prior Publication Data

US 2025/0007628 A1  Jan. 2, 2025

(51) Int. Cl.
*H04B 17/17* (2015.01)
(52) U.S. Cl.
CPC .................... *H04B 17/17* (2015.01)
(58) Field of Classification Search
CPC .......................................... H04B 17/17
See application file for complete search history.

(56) References Cited

U.S. PATENT DOCUMENTS

| 8,867,595 | B1 | 10/2014 | Luo et al. |
| 8,923,442 | B2 | 12/2014 | Chandrasekaran |
| 9,160,296 | B2* | 10/2015 | Ehyaie .................. H01Q 1/246 |
| 9,306,654 | B2 | 4/2016 | Hwang et al. |
| 9,564,879 | B1* | 2/2017 | Luo ...................... G11C 29/022 |
| 2002/0175709 | A1* | 11/2002 | Hairapetian ... H03K 19/018528 326/86 |
| 2013/0307607 | A1 | 11/2013 | Oh |
| 2014/0149654 | A1* | 5/2014 | Venkatesan ............ G11C 5/147 327/307 |
| 2019/0238168 | A1* | 8/2019 | Nedovic .................. H04B 1/10 |

FOREIGN PATENT DOCUMENTS

WO    2015105810    7/2015

OTHER PUBLICATIONS

Partial International Search Report—PCT/US2024/029727—ISA/EPO—Sep. 19, 2024.
International Search Report and Written Opinion—PCT/US2024/029727—ISA/EPO—Dec. 18, 2024.

\* cited by examiner

*Primary Examiner* — Rahel Guarino
(74) *Attorney, Agent, or Firm* — Loza & Loza, LLP

(57) ABSTRACT

An apparatus, including: a first signal receiver circuit including: a first reference voltage generator configured to generate a first reference voltage that tracks noise present in a supply voltage used to generate a first single-ended signal; and a first comparator configured to generate a first signal based on a comparison of the first single-ended signal and the first reference voltage.

27 Claims, 4 Drawing Sheets

DATA COMMUNICATION APPARATUS WITH RECEIVER EMPLOYING TRANSMITTER SUPPLY VOLTAGE NOISE COMPENSATION

FIELD

Aspects of the present disclosure relate generally to data communication links, and in particular, to a single-ended data communication apparatus including a receiver employing transmitter supply voltage noise compensation for improved received data detection.

BACKGROUND

Data communication links, such as serializer/deserializer (SERDES) links, are used to communicate data signals between integrated circuits (ICs) and other components. Some of the data communication links communicate data via single-ended signaling as it may save power, circuit footprint, and is generally less complex than a data communication link that uses differential signaling.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a first reference voltage generator; a first comparator including a first input configured to receive a single-ended data signal, a second input coupled to the first reference voltage generator; a filter configured to receive a single-ended clock signal; and a control circuit including an input coupled to an output of the filter, and an output coupled to the first reference voltage generator.

Another aspect of the disclosure relates to an apparatus. The apparatus includes: a first signal receiver circuit comprising: a first reference voltage generator configured to generate a first reference voltage that tracks noise present in a supply voltage used to generate a first single-ended signal; and a first comparator configured to generate a first signal based on a comparison of the first single-ended signal and the first reference voltage.

Another aspect of the disclosure relates to a method. The method includes generating a reference voltage that tracks a noise in a supply voltage used to generate a single-ended data signal; and comparing the single-ended data signal with the reference voltage to generate a data signal.

Another aspect of the disclosure relates to an apparatus. The apparatus includes means for generating a reference voltage that tracks a noise in a supply voltage used to generate a single-ended data signal; and means for comparing the single-ended data signal with the reference voltage to generate a data signal.

Another aspect of the disclosure relates to a wireless communication device. The wireless communication device includes: at least one antenna; a transceiver coupled to the at least one antenna; one or more signal processing cores coupled to the transceiver via a set of one or more signal transmitter circuits and a set of one or more signal receiver circuits, wherein at least one of the set of one or more signal receiver circuits, comprises: a reference voltage generator configured to generate a reference voltage that tracks noise present in a supply voltage used in at least one of the set of one or more signal transmitter circuits; and a comparator configured to generate a received signal based on a comparison of a single-ended signal generated by the at least one of the set of one or more signal transmitter circuits and the reference voltage.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
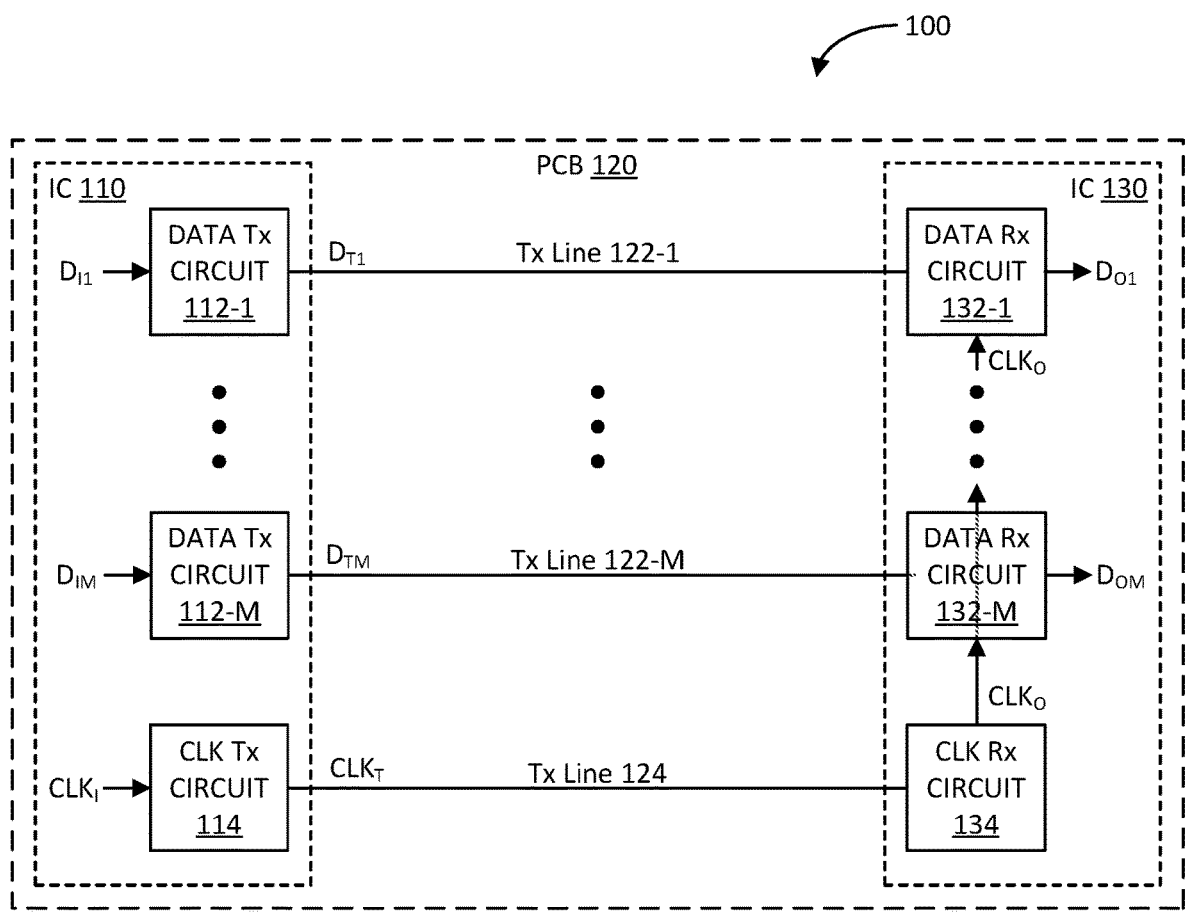
FIG. 1 illustrates a block diagram of an example data communication apparatus in accordance with an aspect of the disclosure.

FIG. 1 illustrates a block diagram of an example data communication apparatus 100 in accordance with an aspect of the disclosure. The data communication apparatus 100 may be implemented as a serializer/deserializer (SERDES) that uses single-ended data signal transmission for transmitting data from a source integrated circuit (IC) to a destination IC via a data communication channel, such as one or more metal transmission lines of a printed circuit board (PCB).

In particular, the data communication apparatus 100 includes a first integrated circuit (IC) 110 and a second IC 130, both of which may be securely mounted on a printed circuit board (PCB) 120. The first IC 110 may include a set of one or more data signal transmitter (Tx) circuits 112-1 to 112-M. Additionally, the first IC 110 may include a clock signal transmitter (Tx) circuit 114.

The set of one or more data signal transmitter circuits 112-1 to 112-M are configured to receive a set of one or more input data signals $D_{I1}$ to $D_{IM}$, and generate a set of one or more single-ended data signals $D_{T1}$ to $D_{TM}$ based on the set of one or more input data signals $D_{I1}$ to $D_{IM}$, respectively. The set of one or more data signal transmitter circuits 112-1 to 112-M are coupled to a set of one or more transmission lines (e.g., metal traces) 122-1 to 122-M on the PCB 120 for transmission of the set of one or more single-ended data signals $D_{T1}$ to $D_{TM}$ to the second IC 130, respectively. Similarly, the clock signal transmitter circuit 114 is configured to receive an input clock signal $CLK_I$, and generate a single-ended clock signal $CLK_T$ based on the input clock signal $CLK_I$. A clock signal, as defined herein, is a substantially periodic signal (e.g., substantially square wave) whose frequency controls the rate at which data is sent from the IC 110 to the IC 130. The clock signal transmitter circuit 114 is coupled to a transmission line (e.g., metal trace) 124 on the PCB 120 for transmission of the single-ended clock signal $CLK_T$ to the second IC 130.

The second IC 130 may include a set of one or more data signal receiver (Rx) circuits 132-1 to 132-M. Additionally, the second IC 130 includes a clock signal receiver (Rx) circuit 134. The clock signal receiver circuit 134 is coupled to the transmission line 124 to receive the single-ended clock signal $CLK_T$, and generate an output clock signal $CLK_O$ based on the single-ended clock signal $CLK_T$. The set of one or more data signal receiver circuits 132-1 to 132-M are coupled to the set of one or more data transmission lines 122-1 to 122-M to receive the set of one or more single-ended data signals $D_{T1}$ to $D_{TM}$ from the first IC 110, respectively. The set of one or more data signal receiver circuits 132-1 to 132-M are configured to generate a set of one or more output data signals $D_{O1}$ to $D_{OM}$ based on the set of one or more single-ended data signals $D_{T1}$ to $D_{TM}$ and the output clock signal $CLK_O$, respectively.

Although, in this example, the data communication apparatus 100 is described as being unidirectional (e.g., data transmitted from the IC 110 to the IC 130), it shall be understood that the data communication apparatus 100 may be implemented for bidirectional data communication in a similar manner.

Figure 2:
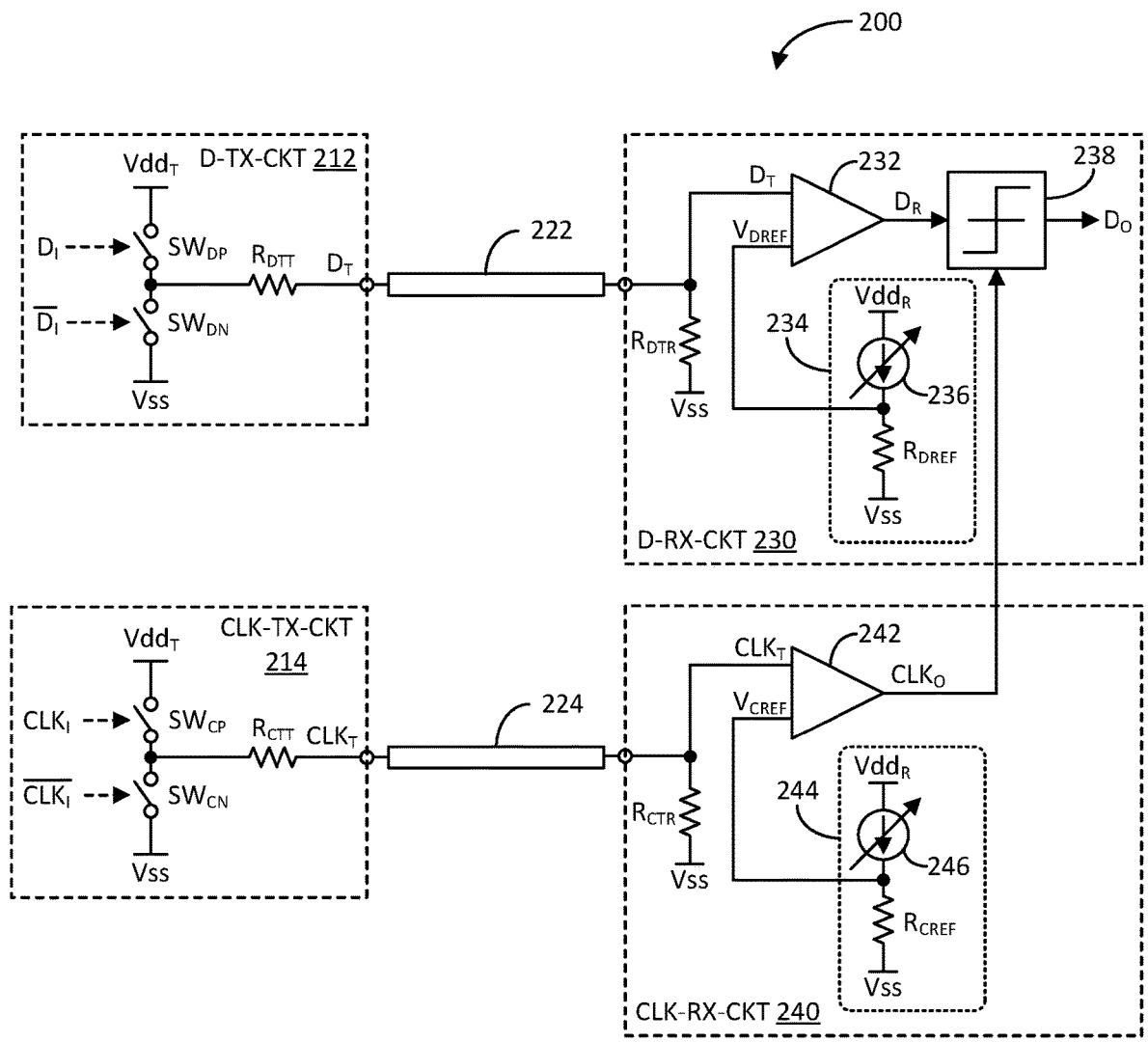
FIG. 2 illustrates a block diagram of another example data communication apparatus in accordance with another aspect of the disclosure.

FIG. 2 illustrates a block diagram of another example data communication apparatus 200 in accordance with another aspect of the disclosure. The data communication apparatus 200 may be an example more detailed implementation of at least a portion of the data communication apparatus 100 previously discussed.

In particular, the data communication apparatus 200 includes a data signal transmitter circuit (D-TX-CKT) 212, a data signal receiver circuit (D-RX-CKT) 230, and a transmission line 222 coupling the data signal transmitter circuit 212 to the data signal receiver circuit 230. Additionally, the data communication apparatus 200 includes a clock signal transmitter circuit (CLK-TX-CKT) 214, a clock signal receiver circuit (CLK-RX-CKT) 240, and a transmission line 224 coupling the clock signal transmitter circuit 214 to the clock signal receiver circuit 240.

The data signal transmitter circuit 212 includes a driver circuit (e.g., may also be referred to as a level shifter, buffer, and/or one or more cascaded inverters) including a first switching device $SW_{DP}$ and a second switching device $SW_{DN}$ coupled in series between an upper voltage rail $Vdd_T$ and a lower voltage rail Vss (e.g., ground). The first and second switching devices $SW_{DP}$ and $SW_{DN}$ may be implemented as field effect transistors (FETs), such as a p-channel metal oxide semiconductor FET (PMOS FET) and an n-channel metal oxide semiconductor FET (NMOS FET), respectively. The first and second switching devices $SW_{DP}$ and $SW_{DN}$ may be controllably driven by an input data signal $D_I$, such as complementary data signals $D_I$ and $\overline{D_I}$, respectively. The data signal transmitter circuit 212 further includes a termination resistor $R_{DTT}$ (e.g., 50 Ohms ($\Omega$)) coupled between an output of the driver circuit (e.g., node between the switching devices $SW_{DP}$ and $SW_{DN}$) and a first end of the transmission line 222 (e.g., which may have a characteristic impedance of 50$\Omega$).

Similarly, the clock signal transmitter circuit 214 includes a driver circuit (e.g., may also be referred to as a level shifter, buffer, and/or one or more cascaded inverters) including a first switching device $SW_{CP}$ and a second switching device $SW_{CN}$ coupled in series between the upper voltage rail $Vdd_T$ and the lower voltage rail Vss. The first and second switching devices $SW_{CP}$ and $SW_{CN}$ may be implemented as FETs, such as a PMOS FET and an NMOS FET, respectively. The first and second switching devices $SW_{CP}$ and $SW_{CN}$ may be controllably driven by an input clock signal $CLK_I$, such as complementary clock signals $CLK_I$ and $\overline{CLK_I}$, respectively. The clock signal transmitter circuit 214 further includes a termination resistor $R_{CTT}$ (e.g., 50$\Omega$) coupled between an output of the driver circuit (e.g., node between the switching devices $SW_{CP}$ and $SW_{CN}$) and a first end of the transmission line 224 (e.g., which may have a characteristic impedance of 50$\Omega$).

The data signal receiver circuit 230 includes a comparator (e.g., amplifier) 232, a data sampling circuit (e.g., flip-flop) 238, a reference voltage generator 234, and a termination resistor $R_{DTR}$. The comparator 232 includes a first input coupled to a second end of the transmission line 222. The termination resistor $R_{DTR}$ (e.g., 50$\Omega$) is coupled between the second end of the transmission line 222 and a lower voltage rail Vss (e.g., ground). The comparator 232 further includes a second input configured to receive a direct current (DC) reference voltage $V_{DREF}$ generated by the reference voltage generator 234. The comparator 232 further includes an output coupled to a data input of the data sampling circuit 238. The data sampling circuit 238 further includes a data output and a clock input, as discussed further herein.

The reference voltage generator 234, in turn, includes a current source (e.g., a variable current source, such as a current digital-to-analog converter (DAC)) 236 coupled in series with a resistor $R_{DREF}$ between an upper voltage rail $Vdd_R$ and the lower voltage rail Vss. The current source 236 is configured to generate a current that flows through the resistor $R_{DREF}$ to generate the reference voltage $V_{DREF}$ at a node (e.g., which is coupled to the second input of the comparator 232) between the current source 236 and the resistor $R_{DREF}$. The current source 236 may be calibrated to generate the reference voltage $V_{DREF}$ to be substantially ¼ nominal or target supply voltage (also referred to as $Vdd_T$) at the upper voltage rail $Vdd_T$ of the data signal transmitter circuit 212. Or stated differently, the current source 236 may be calibrated to generate the reference voltage $V_{DREF}$ at substantially half the nominal or target voltage swing (common mode voltage) of the single-ended data signal $D_T$ (which is based on the transmitter target supply voltage $Vdd_T$) at the first input of the comparator 232.

The clock signal receiver circuit 240 includes a comparator (e.g., amplifier) 242, a reference voltage generator 244, and a termination resistor $R_{CTR}$. The comparator 242 includes a first input coupled to a second end of the transmission line 224. The termination resistor $R_{CTR}$ (e.g., 50Ω) is coupled between the second end of the transmission line 224 and the lower voltage rail Vss. The comparator 242 further includes a second input configured to receive a DC reference voltage $V_{CREF}$ generated by the reference voltage generator 244. The comparator 242 further includes an output coupled to the clock input of the data sampling circuit 238 of the data signal receiver circuit 230.

The reference voltage generator 244, in turn, includes a current source 246 (e.g., a variable current source, such as a current DAC) coupled in series with a resistor $R_{CREF}$ between the upper voltage rail $Vdd_R$ and the lower voltage rail Vss. The current source 246 is configured to generate a current that flows through the resistor $R_{CREF}$ to generate the reference voltage $V_{CREF}$ at a node (e.g., which is coupled to the second input of the comparator 242) between the current source 246 and the resistor $R_{CREF}$. The current source 246 may also be calibrated to generate the reference voltage $V_{CREF}$ to be substantially ¼ the nominal or target supply voltage $Vdd_T$ at the upper voltage rail $Vdd_T$ of the clock signal transmitter circuit 214. Or stated differently, the current source 246 may be calibrated to generate the reference voltage $V_{CREF}$ at substantially half the nominal or target voltage swing (common mode voltage) of the single-ended clock signal $CLK_T$ (which is based on the transmitter target supply voltage $Vdd_T$) at the first input of the comparator 242.

In operation, the complementary input data signal $D_I/\overline{D_I}$ is applied to the driver circuit $SW_{DP}/SW_{DN}$, which generates the single-ended data signal $D_T$ for transmission to the data signal receiver circuit 230 via the transmission line 222. The termination resistors $R_{DTT}$ and $R_{DTR}$, each having a resistance substantially equal to the characteristic impedance of the transmission line 222, prevent or reduce reflections of the single-ended data signal $D_T$ as it propagates from the data signal transmitter circuit 212 to the data signal receiver circuit 230. Similarly, the complementary clock signal $CLK_I/\overline{CLK_I}$ is applied to the driver circuit $SW_{CP}/SW_{CN}$, which generates the single-ended clock signal $CLK_T$ for transmission to the clock signal receiver circuit 240 via the transmission line 224. The termination resistors $R_{CTT}$ and $R_{CTR}$, each having a resistance substantially equal to the characteristic impedance of the transmission line 224, prevent or reduce reflections of the single-ended clock signal $CLK_T$ as it propagates from the clock signal transmitter circuit 214 to the clock signal receiver circuit 240.

At the data signal receiver circuit 230, the comparator 232 compares the single-ended data signal $D_T$ at its first input to the reference voltage $V_{DREF}$ at its second input to generate a data signal $D_R$. For example, if the voltage level of the single-ended data signal $D_T$ is at substantially ½ the transmitter supply voltage $Vdd_T$ and the reference voltage $V_{DREF}$ is at substantially ¼ $Vdd_R$ (e.g., $Vdd_T \approx Vdd_R$) then the comparator 232 generates the data signal $D_R$ at a logic high voltage. Similarly, if the voltage level of the single-ended data signal $D_T$ is at substantially Vss potential (e.g., ground or 0V) and the reference voltage $V_{DREF}$ is at substantially ¼ $Vdd_R$, then the comparator 232 generates the data signal $D_R$ at a logic low voltage.

Similarly, at the clock signal receiver circuit 240, the comparator 242 compares the single-ended clock signal $CLK_T$ at its first input to the reference voltage $V_{CREF}$ at its second input to generate an output clock signal $CLK_O$. For example, if the voltage level of the single-ended clock signal $CLK_T$ is at substantially ½ the transmitter supply voltage $Vdd_T$ and the reference voltage $V_{CREF}$ is at substantially ¼ $Vdd_R$, then the comparator 242 generates the output clock signal $CLK_T$ at a logic high voltage. Similarly, if the voltage level of the single-ended clock signal $CLK_T$ is at substantially Vss potential (e.g., ground or 0V) and the reference voltage $V_{CREF}$ is at substantially ¼ $Vdd_R$, then the comparator 242 generates the output clock signal $CLK_O$ at a logic low voltage. At the data signal receiver circuit 230 again, the data sampling circuit 238 generates an output data signal $D_O$ by sampling the data signal $D_R$ based on the output clock signal $CLK_O$.

An issue with the data communication apparatus 200 stems from the fact that the supply voltage $Vdd_T$ at the transmitter circuits 212 and 214 may vary due to noise, while the reference voltages $V_{DREF}$ and $V_{CREF}$ at the receiver circuits 230 and 240 are substantially constant. The optimal reference voltages should vary with the supply voltage $Vdd_T$ noise to optimize the detection and sampling of the data signal $D_R$. The constant reference voltages $V_{DREF}$ and $V_{CREF}$ may not be optimal for noise-varying supply voltage $Vdd_T$, which results in jitter present in the data signal $D_R$ and reduction in the setup and hold timing margins at the data sampling circuit 238.

Figure 3:
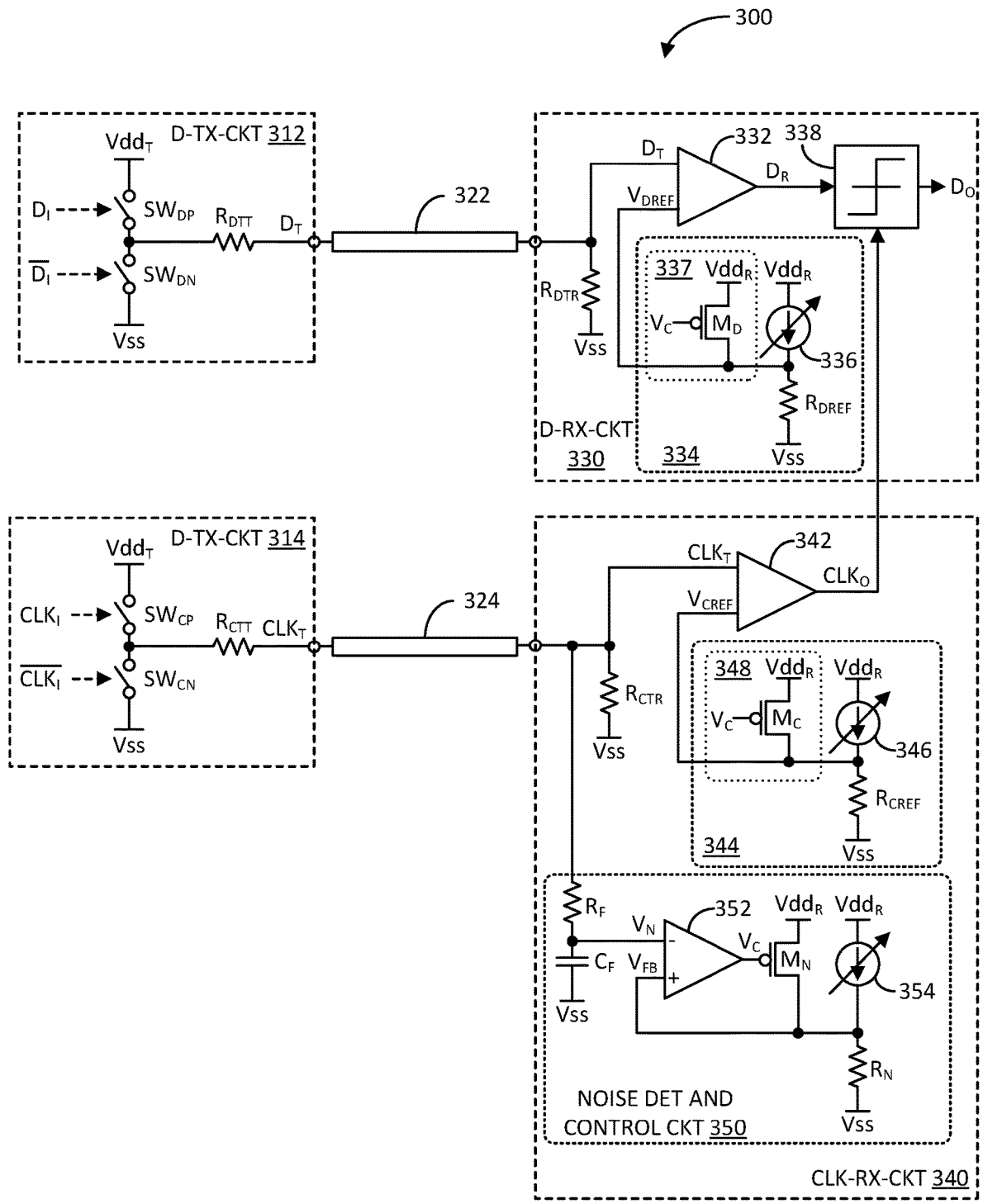
FIG. 3 illustrates a block diagram of another example data communication apparatus in accordance with another aspect of the disclosure.

FIG. 3 illustrates a block diagram of another example data communication apparatus 300 in accordance with another aspect of the disclosure. The data communication apparatus 300 may be an example more detailed implementation of at least a portion of the data communication apparatus 100 previously discussed. As discussed in more detail herein, the data communication apparatus 300 includes a noise detection and control circuit configured to detect noise in the transmitter supply voltage and generate a control signal for a noise tracking circuit configured to adjusts the corresponding reference voltage to track the noise present in the transmitter supply voltage. As the reference voltage tracks the transmitter supply voltage noise, a reduction in the jitter present in the data signal $D_R$ and an improvement in the setup and hold timing margins at a data sampling circuit 238 may be achieved.

In particular, the data communication apparatus 300 includes a data signal transmitter circuit (D-TX-CKT) 312, a data signal receiver circuit (D-RX-CKT) 330, and a transmission line 322 coupling the data signal transmitter circuit 312 to the data signal receiver circuit 330. Additionally, the data communication apparatus 300 includes a clock signal transmitter circuit (CLK-TX-CKT) 314, a clock signal receiver circuit (CLK-RX-CKT) 340, and a transmission line 324 coupling the clock signal transmitter circuit 314 to the clock signal receiver circuit 340.

The data and clock signal transmitter circuits 312 and 314 are similar to data and clock signal transmitter circuits 212 and 214, respectively. The data signal transmitter circuit 312 includes a driver circuit (e.g., may also be referred to as a level shifter, buffer, and/or one or more cascaded inverters) including a first switching device (e.g., FET) $SW_{DP}$ and a second switching device (e.g., FET) $SW_{DN}$ coupled in series between an upper voltage rail $Vdd_T$ and a lower voltage rail Vss (e.g., ground). The first and second switching devices $SW_{DP}$ and $SW_{DN}$ may be controllably driven by an input data signal $D_I$, such as complementary data signals $D_I$ and $\overline{D_I}$, respectively. The data transmitter circuit 312 further includes a termination resistor $R_{DTT}$ (e.g., 50Ω) coupled between an output of the driver circuit (e.g., node between the switching devices $SW_{DP}$ and $SW_{DN}$) and a first end of the transmission line 322 (e.g., which may have a characteristic impedance of 50Ω).

Similarly, the clock signal transmitter circuit 314 includes a driver circuit (e.g., may also be referred to as a level shifter, buffer, and/or one or more cascaded inverters) including a first switching device (e.g., FET) $SW_{CP}$ and a second switching device (e.g., FET) $SW_{CN}$ coupled in series between the upper voltage rail $Vdd_T$ and the lower voltage rail Vss. The first and second switching devices $SW_{CP}$ and $SW_{CN}$ may be controllably driven by an input clock signal $CLK_I$, such as complementary clock signals $CLK_I$ and $\overline{CLK}_I$, respectively. The clock signal transmitter circuit 314 further includes a termination resistor $R_{CTT}$ (e.g., 50Ω) coupled between an output of the driver circuit (e.g., node between the switching devices $SW_{CP}$ and $SW_{CN}$) and a first end of the transmission line 324 (e.g., which may have a characteristic impedance of 50Ω).

The data signal receiver circuit 330 includes a comparator (e.g., amplifier) 332, a data sampling circuit (e.g., flip-flop) 338, a reference voltage generator 334, and a termination resistor $R_{DTR}$. The comparator 332 includes a first input coupled to a second end of the transmission line 322. The termination resistor $R_{DTR}$ (e.g., 50Ω) is coupled between the second end of the transmission line 322 and a lower voltage rail Vss (e.g., ground). The comparator 332 further includes a second input configured to receive a DC reference voltage $V_{DREF}$ generated by the reference voltage generator 334. The comparator 332 further includes an output coupled to a data input of the data sampling circuit 338. The data sampling circuit 338 further includes a data output and a clock input, as discussed further herein.

The reference voltage generator 334, in turn, includes a current source 336 (e.g., a variable current source, such as a current DAC) coupled in series with a resistor $R_{DREF}$ between an upper voltage rail $Vdd_R$ and the lower voltage rail Vss. The current source 336 is configured to generate a first current that flows through the resistor $R_{DREF}$. The reference voltage generator 334 further includes a noise tracking circuit 337 configured to generate a second current that flows through the resistor $R_{DREF}$ that tracks noise present in the supply voltage $Vdd_T$ of the data signal transmitter circuit 312. In this example, the noise tracking circuit 337 includes a FET (e.g., a PMOS FET) $M_D$ coupled between the upper voltage rail $Vdd_R$ and the resistor $R_{DREF}$. The FET $M_D$ includes a gate configured to receive a control signal $V_C$.

The first and second currents flowing through the resistor $R_{DREF}$ generate the reference voltage $V_{DREF}$ at a node (e.g., which is coupled to the second input of the comparator 332) between the current source 336 and the resistor $R_{DREF}$. The current source 336 may be calibrated to generate the reference voltage $V_{DREF}$ to be substantially ¼ a nominal or target supply voltage $Vdd_T$ of the data transmitter circuit 312. With noise present in the transmitter supply voltage $Vdd_T$, the current source 336 and noise tracking circuit 337 maintain the reference voltage $V_{DREF}$ at substantially half the voltage swing (common mode voltage) of the single-ended data signal $D_T$ (which is based on the transmitter supply voltage $Vdd_T$) at the first input of the comparator 332.

The clock signal receiver circuit 340 includes a comparator (e.g., amplifier) 342, a reference voltage generator 344, a termination resistor $R_{CTR}$, and a noise detection and control circuit 350. The comparator 342 includes a first input coupled to a second end of the transmission line 324. The termination resistor $R_{CTR}$ (e.g., 50Ω) is coupled between the second end of the transmission line 324 and the lower voltage rail Vss. The comparator 342 further includes a second input configured to receive a DC reference voltage $V_{CREF}$ generated by the reference voltage generator 344. The comparator 342 further includes an output coupled to the clock input of the data sampling circuit 338 of the data signal receiver circuit 330.

The reference voltage generator 344, in turn, includes a current source 346 (e.g., a variable current source, such as a current DAC) coupled in series with a resistor $R_{CREF}$ between the upper voltage rail $Vdd_R$ and the lower voltage rail Vss. The current source 346 is configured to generate a first current that flows through the resistor $R_{CREF}$. The reference voltage generator 344 further includes a noise tracking circuit 348 configured to generate a second current that flows through the resistor $R_{CREF}$ that tracks noise present in the supply voltage $Vdd_T$ of the clock signal transmitter circuit 314. In this example, the noise tracking circuit 348 includes a FET (e.g., a PMOS FET) $M_C$ coupled between the upper voltage rail $Vdd_R$ and the resistor $R_{CREF}$. The FET $M_C$ includes a gate configured to receive the control signal $V_C$.

The first and second currents flowing through the resistor $R_{CREF}$ generate the reference voltage $V_{CREF}$ at a node (e.g., which is coupled to the second input of the comparator 342) between the current source 346 and the resistor $R_{CREF}$. The current source 346 may be calibrated to generate the reference voltage $V_{CREF}$ to be substantially ¼ the nominal or target supply voltage $Vdd_T$ of the clock signal transmitter circuit 314. With noise present in the transmitter supply voltage $Vdd_T$, the current source 346 and noise tracking circuit 348 maintain the reference voltage $V_{CREF}$ at substantially half the voltage swing (common mode voltage) of the single-ended clock signal $CLK_T$ (which is based on the transmitter supply voltage $Vdd_T$) at the first input of the comparator 342.

In this example, the noise detection and control circuit 350 includes a low pass filter (LPF) including a resistor $R_F$ and a capacitor $C_F$ coupled in series between a second end of the transmission line 324 and the lower voltage rail Vss. The LPF is configured to filter the single-ended clock signal $CLK_T$ to generate a transmitter supply voltage noise signal $V_N$ at a node between the resistor $R_F$ and the capacitor $C_F$.

The noise detection and control circuit 350 further includes an operational amplifier 352, a FET (e.g., PMOS FET) $M_N$, a current source 354, and a resistor $R_N$. The current source 354 (e.g., a variable current source, such as a current DAC) is coupled in series with the resistor $R_N$ between the upper voltage rail $Vdd_R$ and the lower voltage rail Vss. The current source 354 is configured to generate a first current that flows through the resistor $R_N$. The operational amplifier 352 includes a first (e.g., negative) input coupled to the output of the LPF (e.g., the node between the resistor $R_F$ and capacitor $C_F$) to receive the transmitter supply voltage noise signal $V_N$. The operational amplifier 352 includes an output coupled to a gate of the FET $M_N$. The FET $M_N$ is coupled between the upper voltage rail $Vdd_R$ and the resistor $R_N$. The operational amplifier 352 includes a second (e.g., positive) input coupled to the node between the FET $M_N$ and the resistor $R_N$ to receive a feedback signal or voltage $V_{FB}$.

The noise detection and control circuit 350 operates as follows: The LPF ($R_F/C_F$) is configured to generate the transmitter supply voltage noise signal $V_N$, which is provided to the first input of the operational amplifier 352. Via negative feedback, the operational amplifier 352 generates the control signal $V_C$ to cause the FET $M_N$ to generate a second current that causes the feedback voltage $V_{FB}$ at its second input to be substantially equal to the transmitter supply voltage noise signal $V_N$. Accordingly, the second current is related to the transmitter supply voltage noise signal $V_N$. As previously discussed, the control signal $V_C$ is provided to the gates of the FETs $M_D$ and $M_C$ to generate corresponding second currents flowing through resistors $R_{DREF}$ and $R_{CREF}$, respectively. These second currents are also related to the transmitter supply voltage noise signal $V_N$. Accordingly, the reference voltages $V_{DREF}$ and $V_{CREF}$ generated by the reference voltage generators 334 and 344 track the transmitter supply voltage noise signal $V_N$.

The operation of the data communication apparatus 300 operates similar to the data communication apparatus 200 previously discussed, with the exception that the reference voltages $V_{DREF}$ and $V_{CREF}$ track the transmitter supply voltage noise signal $V_N$. That is, the complementary input data signal $D_I/\overline{D_I}$ is applied to the driver circuit $SW_{DP}/SW_{DN}$, which generates the single-ended data signal $D_T$ for transmission to the data signal receiver circuit 330 via the transmission line 322. The termination resistors $R_{DTT}$ and $R_{DTR}$, each having a resistance substantially equal to the characteristic impedance of the transmission line 322, prevent or reduce reflections of the single-ended data signal $D_T$ as it propagates from the data signal transmitter circuit 312 to the data signal receiver circuit 330. Similarly, the complementary clock signal $CLK_I/\overline{CLK_I}$ is applied to the driver circuit $SW_{CP}/SW_{CN}$, which generates the single-ended clock signal $CLK_T$ for transmission to the clock signal receiver circuit 340 via the transmission line 324. The termination resistors $R_{CTT}$ and $R_{CTR}$, each having a resistance substantially equal to the characteristic impedance of the transmission line 324, prevent or reduce reflections of the single-ended clock signal $CLK_T$ as it propagates from the clock signal transmitter circuit 314 to the clock signal receiver circuit 340.

At the data signal receiver circuit 330, the comparator 332 compares the single-ended data signal $D_T$ at its first input to the noise-tracking reference voltage $V_{DREF}$ at its second input to generate a data signal $D_R$. For example, if the voltage level of the single-ended data signal $D_T$ is at substantially ½ the transmitter supply voltage $Vdd_T+V_N$ and the reference voltage $V_{DREF}$ is at substantially ¼ ($Vdd_R+V_N$), then the comparator 332 generates the data signal $D_R$ at a logic high voltage. Similarly, if the voltage level of the single-ended data signal $D_T$ is at substantially Vss potential (e.g., ground or 0V) and the reference voltage $V_{DREF}$ is at substantially ¼ ($Vdd_R+V_N$), then the comparator 332 generates the data signal $D_R$ at a logic low voltage.

Similarly, at the clock signal receiver circuit 340, the comparator 342 compares the single-ended clock signal $CLK_T$ at its first input to the noise-tracking reference voltage $V_{CREF}$ at its second input to generate an output clock signal $CLK_O$. For example, if the voltage level of the single-ended clock signal $CLK_T$ is at substantially ½ ($Vdd_T+V_N$) and the reference voltage $V_{CREF}$ is at substantially ¼ ($Vdd_R+V_N$), then the comparator 342 generates the output clock signal $CLK_T$ at a logic high voltage. Similarly, if the voltage level of the single-ended clock signal $CLK_T$ is at substantially Vss potential (e.g., ground or 0V) and the reference voltage $V_{CREF}$ is at substantially ¼ ($Vdd_R+V_N$), then the comparator 342 generates the output clock signal $CLK_O$ at a logic low voltage. At the data signal receiver circuit 330 again, the data sampling circuit 338 generates an output data signal $D_O$ by sampling the data signal $D_R$ based on the output clock signal $CLK_O$.

Figure 4:
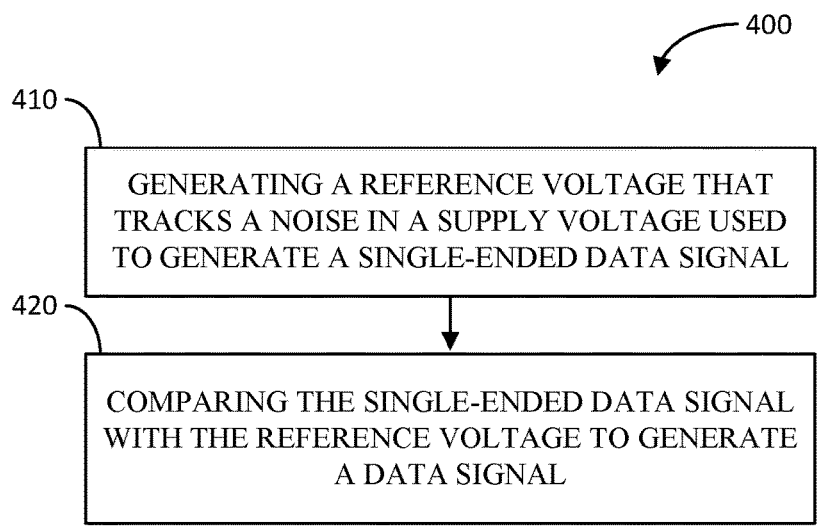
FIG. 4 illustrates a flow diagram of an example method of receiving data in accordance with another aspect of the disclosure.

FIG. 4 illustrates a flow diagram of an example method 400 of receiving data in accordance with another aspect of the disclosure. The method 400 includes generating a reference voltage that tracks a noise in a supply voltage used to generate a single-ended data signal (block 410). Examples of means for generating a reference voltage that tracks a noise in a supply voltage used to generate a single-ended data signal include the reference voltage generator 334 and the noise detection and control circuit 350. Additionally, the method 400 includes comparing the single-ended data signal with the reference voltage to generate a received data signal (block 420). An example of means for comparing the single-ended data signal with the reference voltage to generate a received data signal includes the comparator 332.

According to the method 400, wherein generating the reference voltage may include receiving a single-ended clock signal; generating a supply voltage noise signal related to the noise in the supply voltage based on the single-ended clock signal; and generating the reference voltage based on the supply voltage noise signal. An example of means for receiving a single-ended clock signal includes the noise detection and control circuit 350. An example of means for generating a supply voltage noise signal related to the noise in the supply voltage based on the single-ended clock signal includes the filter (e.g., the resistor $R_F$ coupled in series with the capacitor $C_F$). Examples of means for generating the reference voltage based on the supply voltage noise signal include the operational amplifier 352, the PMOS FET $M_N$, the current source 354, the resistor $R_N$, and the noise tracking circuit 337 (e.g., the PMOS FET $M_D$).

Further, according to the method 400, wherein generating the supply voltage noise signal may include filtering the single-ended clock signal. An example of means filtering the single-ended clock signal includes the filter (e.g., the resistor $R_F$ coupled in series with the capacitor $C_F$). The method 400 may further include sampling the received data signal based on the single-ended clock signal. An example of means for sampling the received data signal based on the single-ended clock signal includes the data sampling circuit (e.g., flip-flop) 338.

Additionally, according to the method 400, generating the reference voltage based on the supply voltage noise signal may include: generating a first current; generating a second current; summing the first and second currents to generate a third current; providing the third current through a resistor to generate a feedback voltage; generating a control signal to control the second current such that the feedback voltage is substantially equal to the supply voltage noise signal; and generating the reference voltage based on the control signal.

An example of means for generating a first current includes the current source (e.g., current DAC) 354. An example of means for generating a second current includes the PMOS FET $M_N$. An example of means for summing the first and second currents to generate a third current is the summing node between the current source 354/PMOS FET $M_N$ and the resistor $R_N$. An example of means for providing the third current through a resistor to generate a feedback voltage is the resistor $R_N$ being coupled between the summing node and the lower voltage rail Vss. An example of means for generating a control signal to control the second current such that the feedback voltage is substantially the same as on the supply voltage noise signal is the operational amplifier 352. And an example of means for generating the reference voltage based on the control signal includes the noise tracking circuit (e.g., PMOS FET $M_D$) 337.

Figure 5:
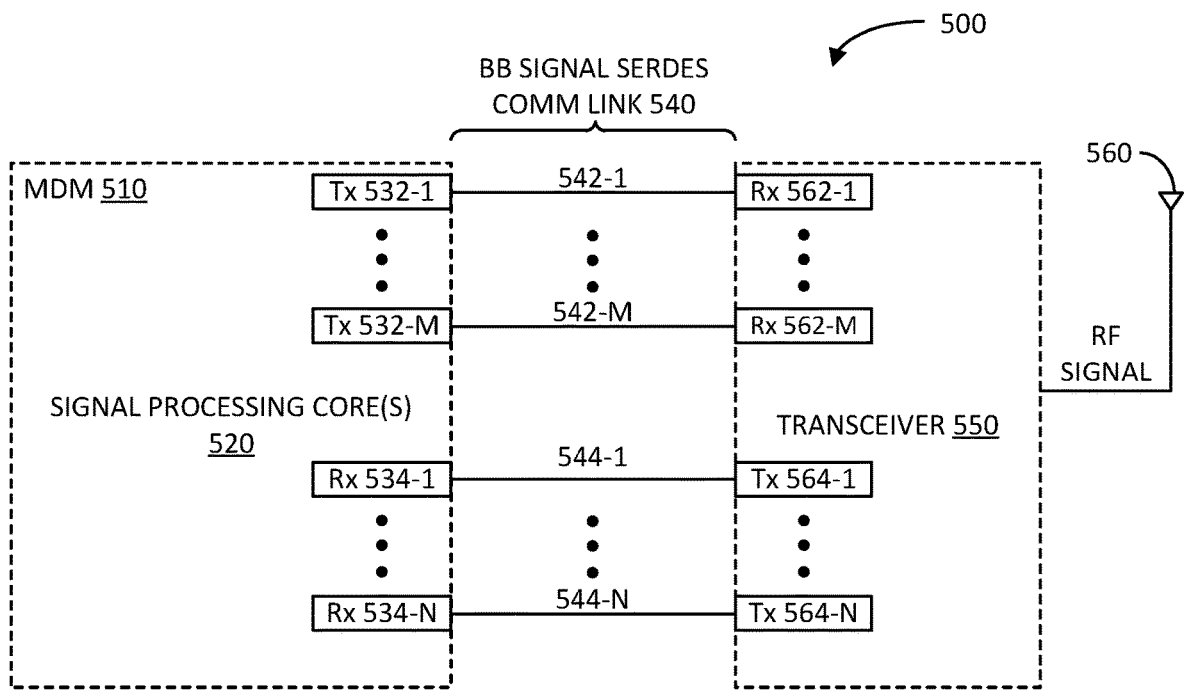
FIG. 5 illustrates a block diagram of an example wireless communication device in accordance with another aspect of the disclosure.

FIG. 5 illustrates a block diagram of an example wireless communication device 500 in accordance with another aspect of the disclosure. The wireless communication device 500 may be a smart phone, a desktop computer, laptop computer, tablet device, Internet of Things (IoT), wearable wireless device (e.g., wireless watch), and other types of wireless device.

In particular, the wireless communication device 500 includes a modem 510. The modem 510 includes one or more signal processing cores 520 configured to generate a transmit baseband (BB) data signal and process a received BB data signal. The modem 510 additionally includes a first set of one or more signal transmitter circuits 532-1 to 532-M configured to transmit the transmit BB data signal including a first clock signal. Each of the first set of one or more signal transmitter circuits 532-1 to 532-M may be implemented per any of the signal transmitter circuits 212, 214, 312, and 314. The modem 510 additionally includes a first set of one or more signal receiver circuits 534-1 to 534-N configured to receive the received BB data signal including a second clock signal. Each of the first set of one or more signal receiver circuits 534-1 to 534-N may be implemented per any of the signal receiver circuits 330 and 340.

The wireless communication device 500 includes a transceiver 550. The transceiver 550 is configured to convert the transmit BB signal into a transmit radio frequency (RF) signal, and convert a received RF signal into the received BB signal. The transceiver 550 is coupled to the at least one antenna 560 to provide thereto the transmit RF signal for electromagnetic radiation into a wireless medium for wireless transmission, and receive the received RF signal electromagnetically picked up from the wireless medium by the at least one antenna 560.

The transceiver 550 additionally includes a second set of one or more signal receiver circuits 562-1 to 562-M configured to receive the transmit BB data signal and the first clock signal. Each of the second set of one or more signal receiver circuits 562-1 to 562-M may be implemented per any of the signal receiver circuits 330 and 340. The transceiver 550 additionally includes a second set of one or more signal transmitter circuits 564-1 to 564-N configured to transmit the received BB data signal and the second clock signal. Each of the second set of one or more signal transmitter circuits 564-1 to 564-N may be implemented per any of the signal transmitter circuits 212, 214, 312, and 314.

Additionally, the wireless communication device 500 further includes a BB signal SERDES communication link 540. The BB signal SERDES communication link 540 comprises a first set of one or more single-ended transmission lines 542-1 to 542-M coupling the first set of one or more signal transmitter circuits 532-1 to 532-M to the second set of one or more signal receiver circuits 562-1 to 562-M for transmission of the transmit BB signal, respectively. The BB signal SERDES communication link 540 comprises a second set of one or more single-ended transmission lines 544-1 to 542-N coupling the second set of one or more signal transmitter circuits 564-1 to 564-N to the first set of one or more signal receiver circuits 534-1 to 534-N for transmission of the received BB signal, respectively.

The following provides an overview of aspects of the present disclosure:

Aspect 1: An apparatus, comprising: a first signal receiver circuit comprising: a first reference voltage generator configured to generate a first reference voltage that tracks noise present in a supply voltage used to generate a first single-ended signal; and a first comparator configured to generate a first signal based on a comparison of the first single-ended signal and the first reference voltage.

Aspect 2: The apparatus of aspect 1, further comprising a noise detection and control circuit configured to generate a supply voltage noise signal related to the noise present in the supply voltage, wherein the first reference voltage is based on the supply voltage noise signal.

Aspect 3: The apparatus of aspect 1 or 2, wherein the first single-ended signal comprises a clock signal.

Aspect 4: The apparatus of aspect 3, wherein the noise detection and control circuit comprises a filter configured to filter the clock signal to generate the supply voltage noise signal.

Aspect 5: The apparatus of aspect 4, wherein the filter comprises a resistor coupled in series with a capacitor, wherein the filter is configured to generate the supply voltage noise signal at a node between the resistor and the capacitor.

Aspect 6: The apparatus of any one of aspects 3-5, wherein the noise detection and control circuit is configured to generate a control signal based on the supply voltage noise signal, wherein the first reference voltage is based on the control signal.

Aspect 7: The apparatus of aspect 6, wherein the noise detection and control circuit comprises: a current source; a resistor coupled in series with the current source between first and second voltage rails; a field effect transistor (FET) coupled between the first voltage rail and the resistor; and an operational amplifier including a first input configured to receive the supply voltage noise signal, a second input coupled to a node between the FET and the resistor, and an output coupled to a gate of the FET, wherein the output of the operational amplifier is configured to produce the control signal.

Aspect 8: The apparatus of aspect 7, wherein the current source comprises a current digital-to-analog converter (DAC).

Aspect 9: The apparatus of aspect 7 or 8, wherein the FET comprises a p-channel metal oxide semiconductor FET.

Aspect 10: The apparatus of any one of aspects 6-9, wherein the first reference voltage generator comprises: a current source; a resistor coupled in series with the current source between first and second voltage rails; and a field effect transistor (FET) coupled between the first voltage rail and the resistor, wherein a gate of the FET is configured to receive the control signal to generate the first reference voltage at a node between the FET and the resistor.

Aspect 11: The apparatus of aspect 10, wherein the current source comprises a current digital-to-analog converter (DAC).

Aspect 12: The apparatus of aspect 10 or 11, wherein the FET comprises a p-channel metal oxide semiconductor FET.

Aspect 13: The apparatus of any one of aspects 1-12, further including a second signal receiver circuit, comprising: a second reference voltage generator configured to generate a second reference voltage that tracks noise present in the supply voltage used to generate a second single-ended signal; and a second comparator configured to generate a second signal based on a comparison of the second single-ended signal and the second reference voltage.

Aspect 14: The apparatus of aspect 13, wherein the first single-ended signal comprises a clock signal, and the second single-ended signal comprises a data signal.

Aspect 15: The apparatus of aspect 14, further comprising a noise detection and control circuit configured to generate a supply voltage noise signal related to the noise present in the supply voltage based on the clock signal.

Aspect 16: The apparatus of aspect 15, wherein the noise detection and control circuit is configured to generate a control signal based on the supply voltage noise signal, wherein the first and second reference voltages are based on the control signal.

Aspect 17: The apparatus of any one of aspects 14-16, wherein the second signal receiver circuit further comprises a sampling circuit configured to sample the second signal based on the clock signal.

Aspect 18: The apparatus of aspect 17, wherein the sampling circuit comprises a flip-flop.

Aspect 19: The apparatus of any one of aspects 13-18, further comprising: a first signal transmitter circuit configured to generate the first single-ended signal; a first transmission line configured to route the first single-ended signal from the first signal transmitter circuit to the first signal receiver circuit; a second signal transmitter circuit configured to generate the second single-ended signal; and a second transmission line configured to route the second single-ended signal from the second signal transmitter circuit to the second signal receiver circuit.

Aspect 20: A method, comprising: generating a reference voltage that tracks noise in a supply voltage used to generate a single-ended data signal; and comparing the single-ended data signal with the reference voltage to generate a data signal.

Aspect 21: The method of aspect 20, wherein generating the reference voltage comprises: receiving a single-ended clock signal; generating a supply voltage noise signal related to the noise in the supply voltage based on the single-ended clock signal; and generating the reference voltage based on the supply voltage noise signal.

Aspect 22: The method of aspect 21, wherein generating the supply voltage noise signal comprises filtering the single-ended clock signal.

Aspect 23: The method of aspect 21 or 22, wherein generating the reference voltage based on the supply voltage noise signal, comprises: generating a first current; generating a second current; summing the first and second currents to generate a third current; providing the third current through a resistor to generate a feedback voltage; generating a control signal to control the second current such that the feedback voltage is substantially equal to the supply voltage noise signal; and generating the reference voltage based on the control signal.

Aspect 24: The method of any one of aspects 21-23, further comprising sampling the data signal based on the single-ended clock signal.

Aspect 25: An apparatus, comprising: means for generating a reference voltage that tracks noise in a supply voltage used to generate a single-ended data signal; and means for comparing the single-ended data signal with the reference voltage to generate a data signal.

Aspect 26: The apparatus of aspect 25, wherein the means for generating the reference voltage comprises: means for receiving a single-ended clock signal; means for generating a supply voltage noise signal related to the noise in the supply voltage based on the single-ended clock signal; and means for generating the reference voltage based on the supply voltage noise signal.

Aspect 27: The apparatus of aspect 26, wherein the means for generating the supply voltage noise signal comprises means for filtering the single-ended clock signal.

Aspect 28: The apparatus of aspect 26 or 27, wherein the means for generating the reference voltage based on the supply voltage noise signal, comprises: means for generating a first current; means for generating a second current; means for summing the first and second currents to generate a third current; means for providing the third current through a resistor to generate a feedback voltage; means for generating a control signal to control the second current such that the feedback voltage is substantially equal to the supply voltage noise signal; and means for generating the reference voltage based on the control signal.

Aspect 29: The apparatus of any one of aspects 26-29, further comprising means for sampling the data signal based on the single-ended clock signal.

Aspect 30: A wireless communication device, comprising: at least one antenna; a transceiver coupled to the at least one antenna; one or more signal processing cores coupled to the transceiver via a set of one or more signal transmitter circuits and a set of one or more signal receiver circuits, wherein at least one of the set of one or more signal receiver circuits, comprises: a reference voltage generator configured to generate a reference voltage that tracks noise present in a supply voltage used in at least one of the set of one or more signal transmitter circuits; and a comparator configured to generate a received signal based on a comparison of a single-ended signal generated by the at least one of the set of one or more signal transmitter circuits and the reference voltage.

Aspect 31: An apparatus, comprising: a first reference voltage generator; a first comparator including a first input configured to receive a single-ended data signal, and a second input coupled to the first reference voltage generator; a filter configured to receive a single-ended clock signal; and a control circuit including an input coupled to an output of the filter, and an output coupled to the first reference voltage generator.

Aspect 32: The apparatus of aspect 31, wherein the filter comprises a resistor coupled in series with a capacitor between a node configured to receive the single-ended clock signal and a voltage rail, wherein the output of the filter is situated between the resistor and the capacitor.

Aspect 33: The apparatus of aspect 31 or 32, wherein the control circuit comprises: an operational amplifier including a first input coupled to the output of the filter; and a first field effect transistor (FET) coupled between a first voltage rail and a second input of the operational amplifier, wherein the first FET includes a gate coupled to an output of the operational amplifier, and wherein the output of the operational amplifier is coupled to the first reference voltage generator.

Aspect 34: The apparatus of aspect 33, wherein the control circuit further comprises: a current source coupled between the first voltage rail and the second input of the operational amplifier; and a resistor coupled between the current source and a second voltage rail.

Aspect 35: The apparatus of aspect 33 or 34, wherein the first reference voltage generator comprises: a current source coupled in series with a resistor between the first voltage rail and a second voltage rail; and a second FET coupled between the first voltage rail and the resistor, wherein the second FET includes a gate coupled to the output of the operational amplifier.

Aspect 36: The apparatus of any one of aspects 31-35, further comprising: a second reference voltage generator coupled to the control circuit; a second comparator including a first input configured to receive the single-ended clock signal, and a second input coupled to the second reference voltage generator; and a sampling circuit including a first input coupled to an output of the first comparator, a second input coupled to an output of the second comparator, and an output configured to generate an output data signal.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:

1. An apparatus, comprising:
a first reference voltage generator;
a first comparator including a first input configured to receive a single-ended data signal, and a second input coupled to the first reference voltage generator;
a filter configured to receive a single-ended clock signal; and
a control circuit including an input coupled to an output of the filter, and an output coupled to the first reference voltage generator, wherein the control circuit comprises:
an operational amplifier including a first input coupled to the output of the filter; and
a first field effect transistor (FET) coupled between a first voltage rail and a second input of the operational amplifier, wherein the first FET includes a gate coupled to an output of the operational amplifier, and wherein the output of the operational amplifier is coupled to the first reference voltage generator.

2. The apparatus of claim 1, wherein the filter comprises a resistor coupled in series with a capacitor between a node configured to receive the single-ended clock signal and a voltage rail, wherein the output of the filter is situated between the resistor and the capacitor.

3. The apparatus of claim 1, wherein the control circuit further comprises:
a current source coupled between the first voltage rail and the second input of the operational amplifier; and
a resistor coupled between the current source and a second voltage rail.

4. The apparatus of claim 1, wherein the first reference voltage generator comprises:
a current source coupled in series with a resistor between the first voltage rail and a second voltage rail; and
a second FET coupled between the first voltage rail and the resistor, wherein the second FET includes a gate coupled to the output of the operational amplifier.

5. The apparatus of claim 1, further comprising:
a second reference voltage generator coupled to the control circuit;
a second comparator including a first input configured to receive the single-ended clock signal, and a second input coupled to the second reference voltage generator; and
a sampling circuit including a first input coupled to an output of the first comparator, a second input coupled to an output of the second comparator, and an output configured to generate an output data signal.

6. An apparatus, comprising:
a first signal receiver circuit comprising:
a first reference voltage generator configured to generate a first reference voltage that tracks noise present in a supply voltage used to generate a first single-ended signal; and
a first comparator configured to generate a first signal based on a comparison of the first single-ended signal and the first reference voltage; and
a noise detection and control circuit configured to generate a supply voltage noise signal related to the noise present in the supply voltage, wherein the first reference voltage is based on the supply voltage noise signal.

7. The apparatus of claim 6, wherein the first single-ended signal comprises a clock signal.

8. The apparatus of claim 7, wherein the noise detection and control circuit comprises a filter configured to filter the clock signal to generate the supply voltage noise signal.

9. The apparatus of claim 8, wherein the filter comprises a resistor coupled in series with a capacitor, wherein the filter is configured to generate the supply voltage noise signal at a node between the resistor and the capacitor.

10. The apparatus of claim 7, wherein the noise detection and control circuit is configured to generate a control signal based on the supply voltage noise signal, wherein the first reference voltage is based on the control signal.

11. The apparatus of claim 10, wherein the noise detection and control circuit comprises:
a current source;
a resistor coupled in series with the current source between first and second voltage rails;
a field effect transistor (FET) coupled between the first voltage rail and the resistor; and
an operational amplifier including a first input configured to receive the supply voltage noise signal, a second input coupled to a node between the FET and the resistor, and an output coupled to a gate of the FET, wherein the output of the operational amplifier is configured to produce the control signal.

12. The apparatus of claim 11, wherein the current source comprises a current digital-to-analog converter (DAC).

13. The apparatus of claim 11, wherein the FET comprises a p-channel metal oxide semiconductor FET.

14. The apparatus of claim 10, wherein the first reference voltage generator comprises:
a current source;
a resistor coupled in series with the current source between first and second voltage rails; and
a field effect transistor (FET) coupled between the first voltage rail and the resistor, wherein a gate of the FET is configured to receive the control signal to generate the first reference voltage at a node between the FET and the resistor.

15. The apparatus of claim 14, wherein the current source comprises a current digital-to-analog converter (DAC).

16. The apparatus of claim 14, wherein the FET comprises a p-channel metal oxide semiconductor FET.

17. The apparatus of claim 6, further including a second signal receiver circuit, comprising:
a second reference voltage generator configured to generate a second reference voltage that tracks noise present in the supply voltage used to generate a second single-ended signal; and
a second comparator configured to generate a second signal based on a comparison of the second single-ended signal and the second reference voltage.

18. The apparatus of claim 17, wherein the first single-ended signal comprises a clock signal, and the second single-ended signal comprises a data signal.

19. The apparatus of claim 18, wherein the noise detection and control circuit is configured to generate the supply voltage noise signal based on the clock signal.

20. The apparatus of claim 19, wherein the noise detection and control circuit is configured to generate a control signal based on the supply voltage noise signal, wherein the first and second reference voltages are based on the control signal.

21. The apparatus of claim 18, wherein the second signal receiver circuit further comprises a sampling circuit configured to sample the second signal based on the clock signal.

22. The apparatus of claim 21, wherein the sampling circuit comprises a flip-flop.

23. A method, comprising:
generating a reference voltage that tracks noise in a supply voltage used to generate a single-ended data signal, wherein generating the reference voltage comprises:
receiving a single-ended clock signal;
generating a supply voltage noise signal related to the noise in the supply voltage based on the single-ended clock signal; and
generating the reference voltage based on the supply voltage noise signal; and
comparing the single-ended data signal with the reference voltage to generate a data signal.

24. The method of claim 23, wherein generating the supply voltage noise signal comprises filtering the single-ended clock signal.

25. The method of claim 23, wherein generating the reference voltage based on the supply voltage noise signal, comprises:
generating a first current;
generating a second current;
summing the first and second currents to generate a third current;
providing the third current through a resistor to generate a feedback voltage;
generating a control signal to control the second current such that the feedback voltage is substantially equal to the supply voltage noise signal; and
generating the reference voltage based on the control signal.

26. The method of claim 23, further comprising sampling the data signal based on the single-ended clock signal.

27. A wireless communication device, comprising:
at least one antenna;
a transceiver coupled to the at least one antenna;
one or more signal processing cores coupled to the transceiver via a set of one or more signal transmitter circuits and a set of one or more signal receiver circuits, wherein at least one of the set of one or more signal receiver circuits, comprises:
a reference voltage generator configured to generate a reference voltage that tracks noise present in a supply voltage used in at least one of the set of one or more signal transmitter circuits; and
a comparator configured to generate a received signal based on a comparison of a single-ended signal generated by the at least one of the set of one or more signal transmitter circuits and the reference voltage; and
a noise detection and control circuit configured to generate a supply voltage noise signal related to the noise present in the supply voltage, wherein the reference voltage is based on the supply voltage noise signal.

* * * * *